United States Patent [19]
Whitlock

[11] 4,233,529
[45] Nov. 11, 1980

[54] TRANSISTORS POWER STAGES
[75] Inventor: Reginald H. Whitlock, Rugeley, England
[73] Assignee: Thorn Automation Limited, Rugeley, England
[21] Appl. No.: 879,880
[22] Filed: Feb. 22, 1978
[30] Foreign Application Priority Data
Feb. 28, 1977 [GB] United Kingdom ............... 8294/77
[51] Int. Cl.³ ........................................... H03K 17/80
[52] U.S. Cl. .................................. 307/414; 307/314; 307/315
[58] Field of Search ............... 307/414, 314, 315, 415, 307/282

[56] References Cited
U.S. PATENT DOCUMENTS
3,666,971  5/1972  Bixby et al. ........................ 307/315

Primary Examiner—James W. Moffitt
Attorney, Agent, or Firm—Howard L. Rose

[57] ABSTRACT

In circuitry comprising a switching power output transistor stage and a driver transistor circuit, energy is stored in a magnetic circuit during the transistor on time to provide the turn off current. First and second magnetically coupled inductors are connected in series on the output of the driver transistor, and the base of the power transistor is connected to the junction point of the two series inductors. One or more diodes are connected in parallel with the first inductor to limit the potential drop across this inductor at turn on, and a parallel combination of at least one diode and a resistor is connected in series with the second inductor. The output stage may be two power transistors connected in a Darlington type configuration with a similar inductive circuit provided for each transistor.

12 Claims, 6 Drawing Figures

TRANSISTORS POWER STAGES

This invention relates to new driving arrangements for power transistors to enable very high efficiencies to be achieved.

With transistors now capable of switching several hundred amperes, the drive requirements become somewhat more difficult. Transistors require equal turn on and turn off base currents that now amount to some tens of amperes, which involves providing both positive and negative supplies capable of handling these currents, with the consequent losses.

One method which has been used to reduce the turn on base current is the Darlington connection of a driver to the power stage, the advantage being that the turn on base current is reduced to about one tenth, i.e. a few amperes, but with the following disadvantages:

(1) Increased losses in the main path (often in the main transistor) due to the higher saturation of the base-emitter junction plus the extra saturation voltage of the collector emitter of the driver transistor.

(2) The opposite polarity turn off bias supply is still required at the full drive capability.

(3) A high voltage driver transistor is required.

The alternative is to use a low voltage driver stage supplying all the current required, thereby eliminating the extra losses of the Darlington configuration. However, with conventional circuitry, supplying equal turn on and turn off currents still gives rise to considerable losses and/or additional complexity of drive circuits.

The present invention provides a solution which minimizes both the power losses and the circuit complexity, whilst maintaining optimum drive conditions for the main transistor. It is estimated that efficiencies greater than 99% can be achieved with this new arrangement at very little increase in cost.

According to the invention, energy is stored in a magnetic circuit during the on time to provide the turn off current; hence only one low voltage supply is required. The arrangement is such, however, that the on state losses are virtually unaltered; in fact all the current supplied by the driver is used to turn the main transistor on, thereby minimising the size of the driver transistor.

The nature of the invention will be better understood from the following description given with reference to the accompanying drawings, in which.

Figure 1:
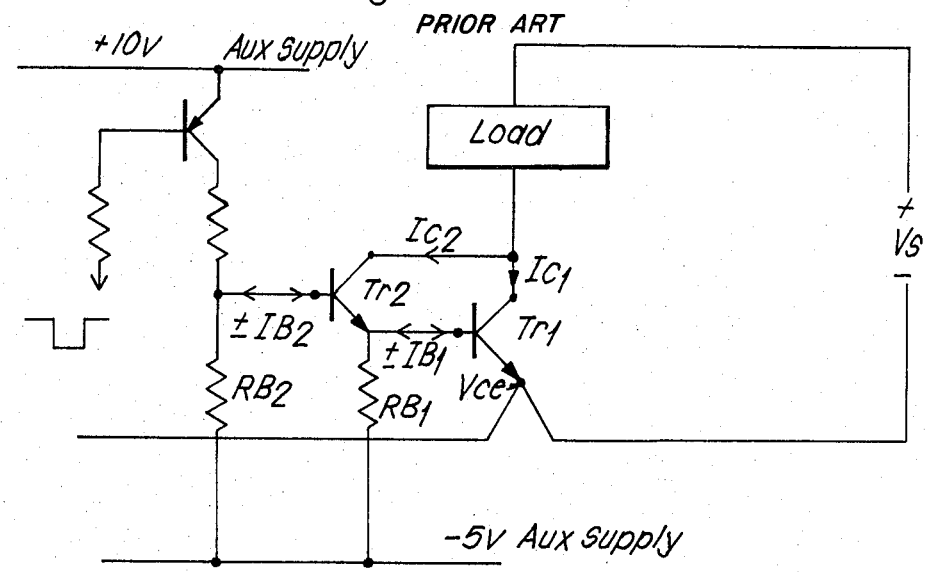
FIG. 1 is a diagram of a known Darlington circuit.

Referring firstly to FIG. 1 this shows a known Darlington circuit. $Tr_1$ is the main power transistor, with $Tr_2$ as the driver, deriving its collector supply from the main power circuit Vs. Whilst the driver collector current $Ic_2$ adds to the load current $Ic_1$, the main power transistor $Tr_1$ cannot saturate due to the higher $Vbe_1$ plus the drop in $Tr_2$ of $Vce_2$ (sat). Typically these two voltages are 1.5 to 3 V for $Vbe_1$ and 1.7 to 2 V for $Vce_2$ (sat). Thus the static power losses in $Tr_1$ are $P_c+P_B=I_{c1}+Vce+IB_1 \times Vbe$ which typically amount to $200\times(2.5+1.7)+20\times2.5=890$ W. This has to be dissipated (as heat) by means of large 'heat sinks' into the cooling media (usually directly into the surrounding air). Also the auxiliary 5 V negative supply has to be capable of providing the $IB_1$ turn off current. A common arrangement is as shown from which it is obvious that considerable power can be wasted in the base resistors during the on state.

Typically $R_{B1}$ would be of the order $0.25\Omega$ (in order to provide a $-IB_1$ of 20 A from the $-5$ V auxiliary supply (limited to this value by the transistor reverse $Vbe_1$ characteristics). Hence in the on state when $Vbe_1$ is positive by some 2.5 V there is 7.5 V across the $0.25\Omega$ which therefore takes 30 A and dissipates 225 W.

Thus $Tr_2$ has to provide not only 20 A drive into the base of $Tr_1$ but also 30 A into $R_{B1}$. Hence $Tr_2$ must be capable of handling 50 A, and since it derives its supply from the collector circuit of $Tr_1$ this must also be a high voltage device and hence expensive.

Similar arguments about losses apply, on a reduced scale, to the base circuit of $Tr_2$.

Thus for $\pm 5$ Amps $IB_2$ drive (assuming $H_{FE}$ of 10 at $Ic_2$ of 50 A), the positive $+10$ V auxiliary supply has to provide 15 A (10 A goes into $R_{B2}$ ($1\Omega$) due to $Vbe_2+Vbe_1 \approx 5$ V.

Hence total losses in a Darlington pair and associated resistors amounts to some 1300 Watts.

At present 200 Amp transistors are available at some 100 V rating, i.e. 20 KW load; therefore 1300 W loss represents a significant ($6\frac{1}{2}\%$) part of the load (especially if the power source is a battery as in an electric vehicle) i.e. Efficiency $\approx 93.5\%$).

Figure 2:
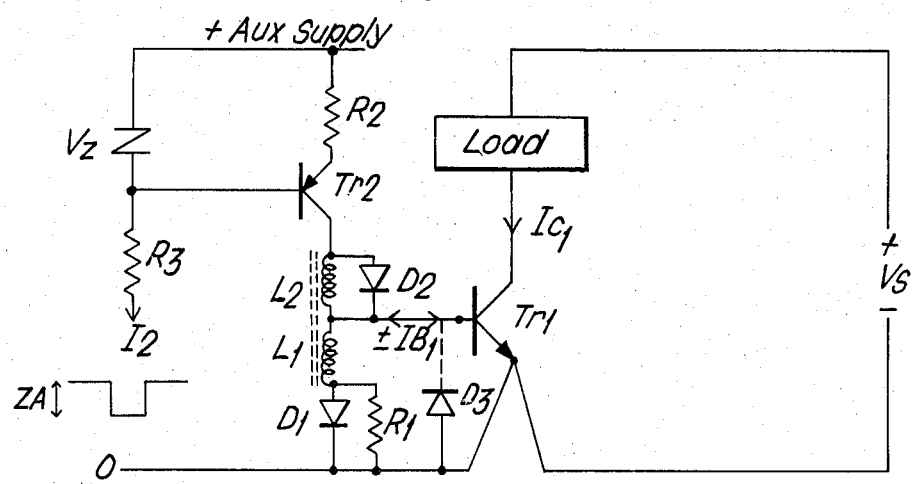
FIGS. 2 to 6 are circuit diagrams of five embodiments of the invention.

FIG. 2 shows a circuit arrangement according to the invention.

In this arrangement, $Tr_1$ is driven into saturation by all the current from $Tr_2$ ($D_1$ [shown as one diode but may be two or more in series] diode VF to be $\geq$ Vbe of $Tr_1$). The switching input ZA is connected between ground and a resistor $R_3$ the other terminal of which is connected to the base (control electrode) of transistor $Tr_2$. The emitter (common electrode) of $Tr_2$ is connected to the positive auxiliary supply via resistor $R_2$ and a zener diode $V_z$ is connected between said supply and the base of transistor $Tr_2$. Drive current $I_2$ flows in the resistor $R_3$. During the on period energy is stored in the coupled inductor $L_1$-$L_2$ by current flowing through winding $L_2$, the current being controlled by some means—a resistor etc. or as shown by the driver transistor $Tr_2$ used as a current source by virtue of feedback in its emitter circuit, the base potential being controlled by $V_z$ in the on condition. Diode(s) $D_2$ limit the potential drop across $L_2$ at turn on to avoid the delay whilst the current is established in the inductor.

At turn off of the transistor $Tr_1$ and $Tr_2$ the inductor tries to maintain the same current flowing and in an endeavour to do this the potential across it reverses rapidly. $Tr_2$ is now non-conducting but since $L_1$ is tightly coupled to $L_2$, diode(s) $D_1$ are forced into conduction, so keeping the current flowing in the inductor but now in a reversed direction in the $Tr_1$ base-emitter circuit.

The current in the inductor gradually decays to zero, governed by the time-constant of the circuit, which is chosen to be long enough to ensure that $Tr_1$ is fully turned off (typically a few micro seconds) after which time the main power transistor is held off by $R_1$ providing a path for the small leakage currents ($R_1$ typically 10 to $100\Omega$).

The losses in this circuit are typically as follows.

$Tr_1$ Vce sat 2 V @200 A=400 W.

(newer transistors are coming along with Vce sat less than 1 V; hence the importance of being able to work with them saturating).

Drive circuit Aux supply 5 V @22 A=110 W.

Total losses 510 W. (1300 W for Darlington).

Hence overall efficiency improved to ≈99%.

Also $Tr_2$ is only a low voltage device therefore cheaper.

The diode $D_3$ is necessary in practice to prevent negative voltage breaking down the base-emitter junction of $Tr_1$ on reverse bias.

The inductor coils $L_1$, $L_2$ will have the same number of turns, but not necessarily the same gauge wire, and may be wound on powdered core material.

The diode $D_2$ can be replaced by an RC circuit; except that it is undesirable to introduce a 'ring' into the circuitry. The diode $D_1$ will usually be more than one diode because the transistor potential drop is quite large. It is not quite true to say that all the current of the $L_1$, $D_1$ circuit goes through the base of the main power transistor because there is a little leakage through the parallel resistor $R_1$; however, substantially all the current flow is through the main power transistor.

Figure 3:
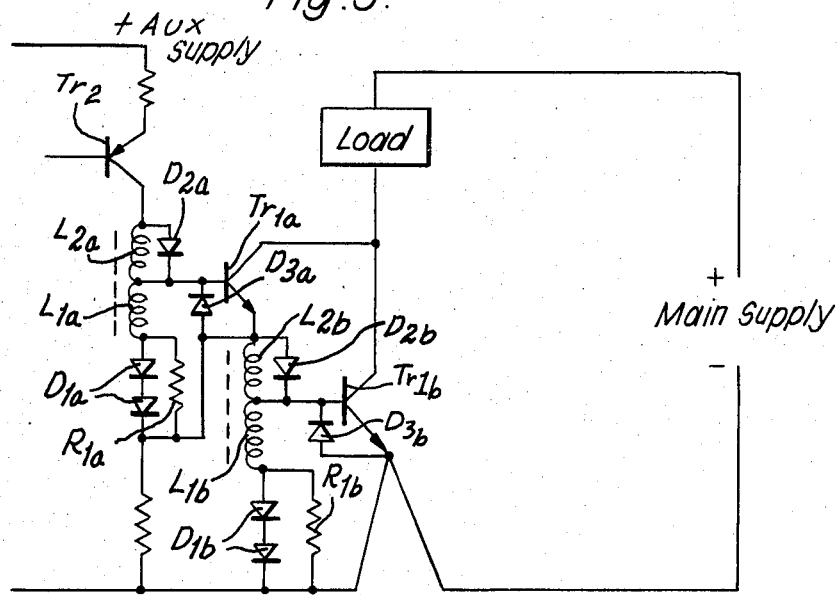
Figure 4:
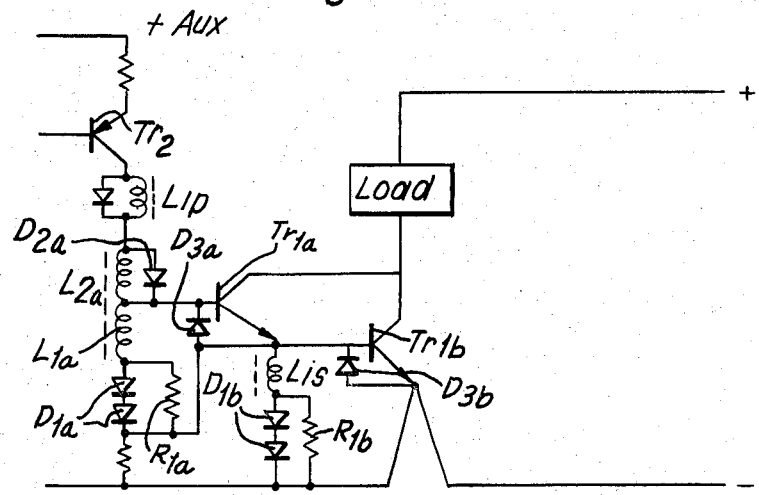

The same principal can be applied to a Darlington connected output stage, as shown in FIG. 3. In this case the transistor $Tr_1$ is replaced by two transistors $Tr_{1a}$ and $Tr_{1b}$ connected as a Darlington pair and each having a base circuit comprising inductors $L_{1a}$, $L_{2a}$ or $L_{1b}$, $L_{2b}$, resistor $R_{1a}$ or $R_{1b}$ and diodes $D_{1a}$, $D_{2a}$, $D_{3a}$ or $D_{1b}$, $D_{2b}$, $D_{3b}$, connected as in the base circuit of transistor $Tr_1$ of FIG. 2. A modification of this circuit is shown in FIG. 4, where the inductors $L_{1b}$, $L_{2b}$ and diode $D_{2b}$ of transistor $TR_{1b}$ are replaced by an inductor $L_{1s}$ connected between the emitter of $Tr_{1a}$ and base of $Tr_{1b}$ and diodes $D_{1b}$, and an inductor $L_{1p}$ with a diode in parallel is connected between the collector (output electrode) of $Tr_2$ and the inductors $L_{1a}$, $L_{2a}$, $L_{1p}$ will have nominally 10×number of turns of $L_{1s}$, corresponding to $Tr_{1a}$ having a gain of 10.

Figure 5:
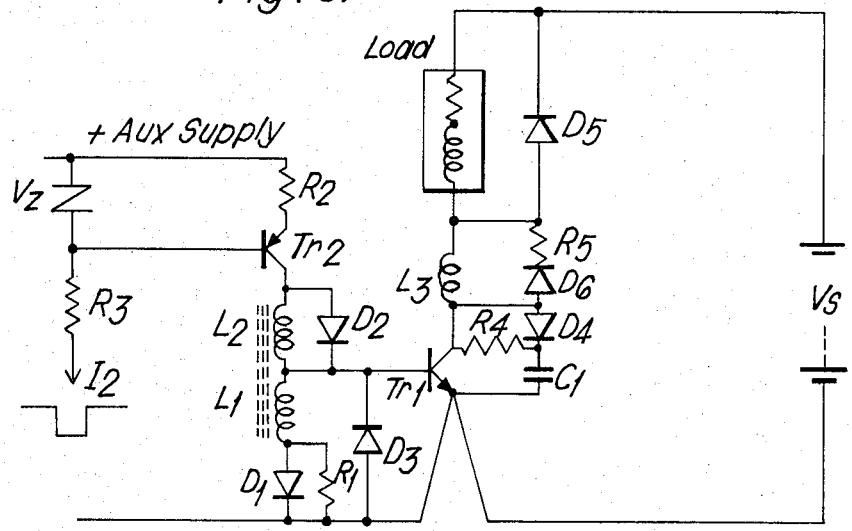

FIG. 5 shows a modification of the circuit of FIG. 2 in which an inductor $L_3$ is used in series with the output load to limit the turn on current to a permissible value within the safe operating area rating (S.O.A.R.) of the main power transistor $Tr_1$. The hole storage effect in the flywheel diode $D_5$ in parallel with the load, necessary with any inductive load, causes the anode of $D_5$ to remain effectively at supply potential after it has been forward biased, until all the carriers have been removed by reverse current. Hence when the transistor $Tr_1$ is turned on, if the current were not limited in some way it would try to short the supply and the transistor $Tr_1$ and/or the diode $D_5$ could be damaged or destroyed. This is prevented by the inductor $L_3$. However, the energy stored in inductor $L_3$ has to be dissipated on turn off and so series-connected diode $D_6$ and resistor $R_5$ (which could be the resistance of the windings of $L_3$) are provided in parallel with the inductor $L_3$.

The R.M.S. rating of diode $D_6$ is much less than that of diode $D_5$ and hence a smaller diode is used and the hole storage is much less so that the current peak is narrower and usually less in amplitude.

The capacitor $C_1$, diode $D_4$ and resistor $R_4$ form a "snubber" network to control the operating locus during turn off. Such networks are well known in use with both silicon-controlled rectifiers and transistors.

Figure 6:
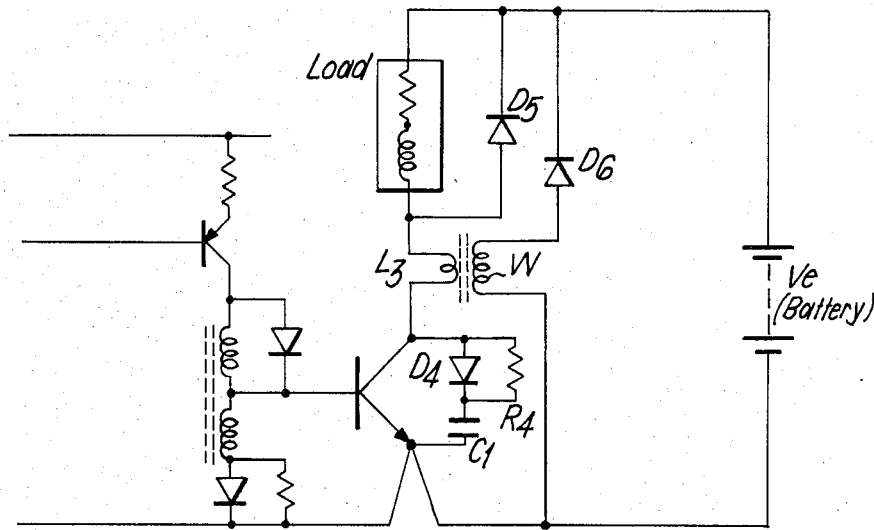

Referring to FIG. 6, when very large currents are being controlled and/or when efficiency is of paramount importance, e.g. in battery electric vehicles, energy can be recovered by using an overwinding (secondary winding) W on inductor $L_3$ having a much larger number of turns and connected across the supply battery Ve in series with a diode $D_6$.

It will be understood that, whereas NPN transistors have been shown, PNP transistors can equally well be used. Also the load can be in the emitter circuit.

I claim:

1. A transistor power switching stage and driver circuit comprising a driver transistor having first and second output electrodes and a control electrode, a power transistor having first and second output electrodes and a control electrode, a switching control circuit connected to the control electrode of said driver transistor, first and second magnetically coupled inductors connected in series electrically to said second output electrode of said driver transistor, a connection between the junction of said series-connected inductors and the control electrode of said power transistor, and at least one diode connected between said second output electrode of said driver transistor and said control electrode of the power transistor.

2. Circuitry according to claim 1, wherein the second inductor is connected to a driver transistor supply line in series with a parallel combination of at least one diode and a resistor.

3. Circuitry according to claim 2, wherein an oppositely poled diode is connected in parallel with the second inductor and said parallel combination.

4. Circuitry according to claim 1 or claim 2 or claim 3, wherein the inductors have the same number of turns and are wound on powdered core material.

5. Circuitry according to claim 1 or claim 2 or claim 3, wherein a second power transistor is connected to the first in Darlington configuration, the same inductive circuit arrangements being provided between the two Darlington connected transistors as between the first such transistor and the driver transistor.

6. Circuitry according to claim 2, wherein a second power transistor is connected to the first in Darlington configuration, a third inductor is connected in series between the output electrode of the driver transistor and the first inductor, a fourth inductor is connected between an output electrode of said first power transistor and said supply line, and the number of turns in the third inductor is greater than the number of turns in the fourth inductor by a factor substantially equal to the gain of the first power transistor.

7. Circuitry according to claim 6, wherein a diode is provided in parallel with said third inductor, and a parallel combination of one or more diodes and a resistor is provided in series with said fourth inductor.

8. Circuitry according to claim 1, further comprising a flywheel diode in parallel with a load connected to the first output electrode of the power transistor, and a load inductor in series with said load to limit the turn on current.

9. Circuitry according to claim 8, wherein a diode circuit is provided in parallel with the load inductor.

10. Circuitry according to claim 8, wherein a snubber network, comprising a resistor, capacitor and diode, is connected across the output electrodes of the power transistor to control the locus of operation during turn off.

11. Circuitry according to claim 8 or claim 10, wherein an overwinding is provided on said load inductor having a much larger number of turns and connected in series with a diode across the load supply.

12. A transistor power switching stage and driver circuit comprising a driver transistor having first and second output electrodes and a control electrode, a power transistor having first and second output electrodes and a control electrode, a switching control circuit connected to the control electrode of said driver transistor, first and second magnetically coupled inductors connected in series electrically to said second output electrode of said driver transistor, a connection between the junction of said series-connected inductors and the control electrode of said power transistor, and at least one diode connected between said second output electrode of said power transistor and end terminal of said series-connected inductors remove from said second output electrode of said driver transistor.

* * * * *